United States Patent [19]

Reisman et al.

[11] 4,449,580
[45] May 22, 1984

[54] VERTICAL WALL ELEVATED PRESSURE HEAT DISSIPATION SYSTEM

[75] Inventors: Arnold Reisman; Melvin Berkenblit, both of Yorktown Heights; Charles J. Merz, III, Hopewell Junction, all of N.Y.

[73] Assignee: International Business Machines Corporation, Armonk, N.Y.

[21] Appl. No.: 280,149

[22] Filed: Jun. 30, 1981

[51] Int. Cl.³ .................. F28D 15/00; H01L 23/46
[52] U.S. Cl. .................. 165/104.34; 357/82; 361/383
[58] Field of Search .............. 165/80 R, 80 D, 80 C, 165/185, 104.34; 357/81, 82; 361/383, 384

[56] References Cited

U.S. PATENT DOCUMENTS

| | | | |
|---|---|---|---|
| 3,487,328 | 12/1969 | Katz | 165/104.34 X |
| 3,638,140 | 1/1972 | Knapp et al. | 165/104.34 X |
| 4,069,864 | 1/1978 | Novoryta et al. | 165/185 X |
| 4,153,107 | 5/1979 | Antonetti et al. | 165/185 |
| 4,246,597 | 1/1981 | Cole et al. | 165/80 D X |

Primary Examiner—Albert W. Davis, Jr.
Attorney, Agent, or Firm—Yen S. Yee

[57] ABSTRACT

A heat dissipating system for cooling circuit chips or modules is described. The disclosed system includes circuit chips or modules which are vertically mounted, a gas at an elevated pressure being contained within an encased module for providing an enhanced thermal coupling between the chips or modules contained therein, and the walls of the encased module, whereby heat removal from the chips or modules is increased. This enhanced thermal coupling is combined with a reduction in the temperature of the walls of the encased modules so as to reduce the thermal resistance between the surrounding gas and the chips or modules to be cooled, whereby heat removal from the circuit chips or modules is substantially increased.

15 Claims, 10 Drawing Figures

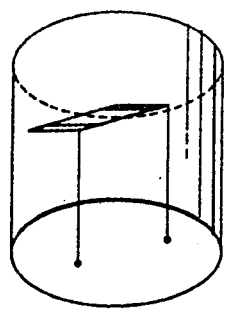
FIG. 4.3
38 WATTS
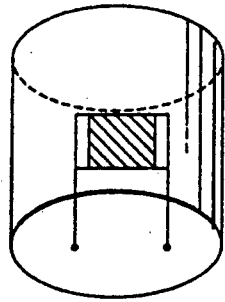
FIG. 4.2
42 WATTS
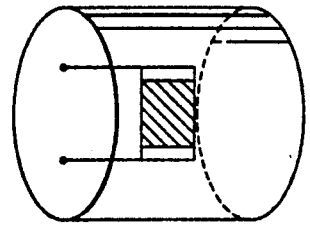
FIG. 4.1
46 WATTS
7°C GAS
1500 PSI
TEMP RISE
TO 100°C
POWER DISSIPATION
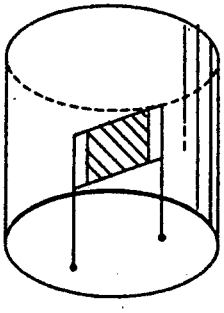
FIG. 4.5
31 WATTS
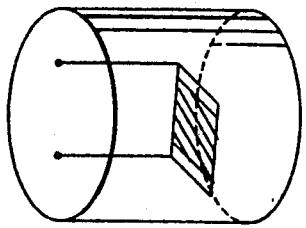
FIG. 4.4
34 WATTS

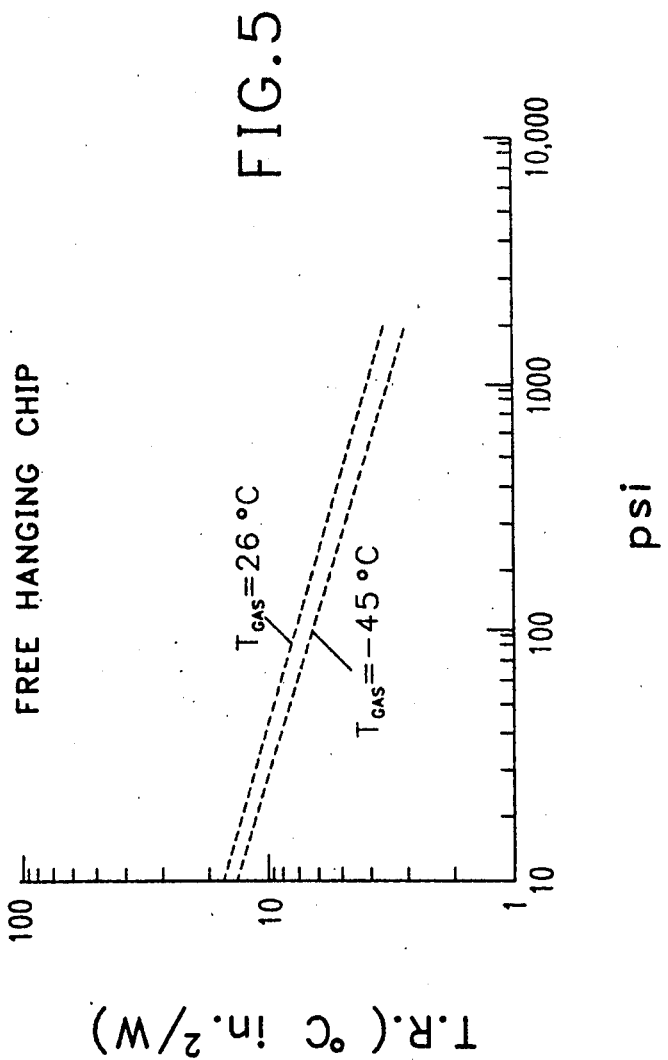

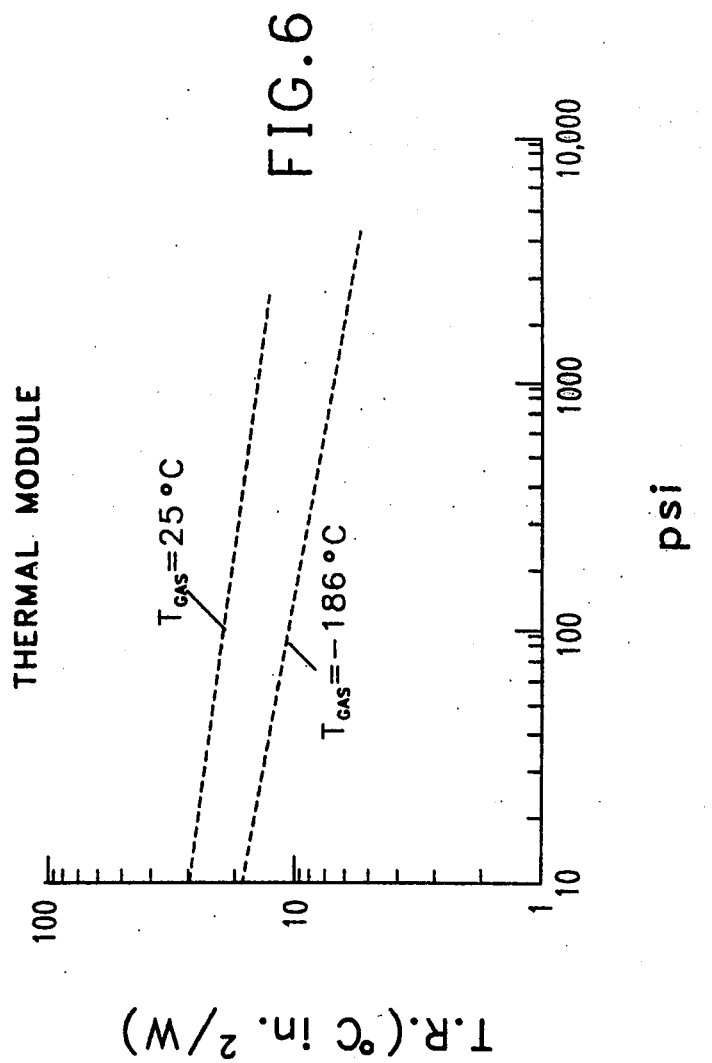

VERTICAL WALL ELEVATED PRESSURE HEAT DISSIPATION SYSTEM

DESCRIPTION

1. Technical Field

This invention relates generally to a heat dissipation system for an electronic apparatus, and more particularly, to means for improving the thermal coupling between a heat source to be cooled and a heat sink.

2. Background Art

The removal of heat from an electrical apparatus has been and is a constantly recurring challenging design problem. Many solutions featuring different heat dissipating techniques have been employed over the years. For example, early heat dissipating systems utilized forced air cooling techniques. When forced air cooling failed to provide adequate heat transfer and removal, the circulation of liquid coolant was used. For large heat loads, designers in more recent years have turned to refrigeration cycle equipment to provide adequate cooling.

The development of large scale integration (LSI) technology and the trend toward very large scale integration (VLSI) have greatly increased the capability and effectiveness of modern electronic systems. At the same time, this technological trend has dramatically increased the number of circuits per unit area.

If electrical and geometric scaling are adhered to rigorously power dissipation per unit would remain constant. However, it is often the case that power supply voltages are not rigorously scaled which therefore tends to increase both the power density and the heat generated thereon. The increased heat generation in a small unit area may often cause deleterious localized heating, and poses an ever-increasing challenge requiring more complex methods of cooling. This cooling requirement is particularly acute in the field of high speed electronic digital computers wherein a very large number of high speed, and therefore, high power circuit chips and modules for both logic and memory are utilized to meet high speed performance requirements.

In order to remove the heat generated by the circuitry on the chips to a heat sink efficiently, an improved conduction heat transfer connector between the circuit chips and the heat sink is essential. Improving the heat conduction path from the circuit chips to the heat sink not only lowers the thermal resistance thus allowing the circuit chips to operate at a higher power level, but alternatively allows a simpler heat sink to be used.

Some prior heat dissipation systems provide such improved conduction heat transfer connection. For instance, U.S. Pat. No. 4,235,283 to O. R. Gupta, assigned to the common assignee of the present invention, discloses a multi-stud thermal conduction module for removing heat from circuit chips contained therein.

The disclosed thermal conductor module comprises a housing made of heat conductive material forming a cap over the circuit chips. The housing contains one or more openings, one opposite each of the chips. Heat conductive elements, which form the conduction heat transfer connection, are spring loaded in each opening so that the end of each element contacts the associated chip thereby lowering the thermal resistance of the interface therebetween.

Heat conductive elements of the type making direct contacts with heat generating circuit chips may give rise to mechanical problems such as vibration, thermal expansion and poor surface to surface contact especially when the chip surface to be contacted by the heat conductive element is slightly tilted. In addition, such a conduction heat transfer connection needs to be adapted to differences in distance between the respective chip and the end of the opening so as not to exceed the force limits that may be applied to the chips.

A prior flexible conduction heat transfer connection is described in U.S. No. Pat. No. 4,156,458 to R. C. Chu et al. According to the patent which is also assigned to the common assignee of the present invention, the connection comprises a heat conductive metallic foil bundle of sufficient thickness to contact the surface area of a chip to provide the required heat transfer and of sufficient thinness to be flexible enough to absorb the expansion and contraction due to temperature changes as well as the difference in distance between the circuit chip and the heat sink.

A more desirous improvement would be a heat dissipating system capable of efficient heat removal without any recourse to contacting the chip itself by solid plungers or solid heat conductors.

A gas encapsulated cooling module is described in U.S. Pat. No. 3,993,123 to R. C. Chu et al, which patent is also assigned to the common assignee of the present invention. According to one embodiment of that patented invention, the encapsulated cooling unit utilizes helium to fill the voids in an interface between a thermal conductive element and a circuit chip to be cooled. Helium is an inert gas having a relatively high heat conductivity. As a result, the interface formed using helium gas has a relatively low thermal resistance. The helium gas is placed therein under a small positive pressure for preventing leakage of the ambient atmosphere into the module. What is still more desirous is a simple and yet effective way to improve the thermal coupling and to lower the thermal resistance of such a gas encapsulated cooling module.

SUMMARY OF THE INVENTION

It is a principal object of this invention to provide an improved heat dissipation system for cooling an electronic apparatus.

It is another principal object of this invention to provide a simple and yet effective thermal coupling between a heat source to be cooled and a heat sink.

It is also a specific object of the present invention to reduce the thermal resistance of an interface between a heat source to be cooled and a heat sink.

It is yet another specific object of the present invention to provide an improved heat dissipation device for circuit chips and modules whereby the chips and modules can be operated at a higher power level.

It is a further object of the present invention to provide an efficient thermal coupling between a heat source to be cooled and a heat sink, thereby enabling the heat source to be operated at a higher power level while allowing a simple heat sink to be used.

It is generally an object of this invention to provide an improved packaging assembly for very large scale integrated circuit chips and modules.

These and other objects of the present invention can be achieved by way of a heat dissipating system having a gas at an elevated pressure being contained within an encased module for providing an enhanced thermal coupling between a heat source contained therein and the walls of said encased module, whereby heat removal from said heat source is increased. Further, a reduction in the temperature of the wall of said encased module reduces the thermal resistance of an interface between the surrounding gas and said heat source to be cooled, whereby heat removal from said heat source is also increased.

The nature, principle and utility of the present invention will be better understood from the hereinafter detailed description of the invention when read in conjunction with the accompanying drawings.

BRIEF DESCRIPTION OF DRAWINGS

Details of the invention will be described in connection with the accompanying drawings, in which:

FIG. 4.1-4.5 shows different chip orientation within the heat dissipation system and its effect on maximum power dissipation.

FIG. 5 shows a plot of the thermal resistance for a free hanging chip as a function of gas pressure, and the thermal resistance dependency on the temperature of the cold walls.

FIG. 6 shows a plot of the thermal resistance for a module mounted chip as a function of gas pressure, and the thermal resistance dependency on the temperature of the cold walls.

DESCRIPTION OF THE PREFERRED EMBODIMENTS

Figure 1:
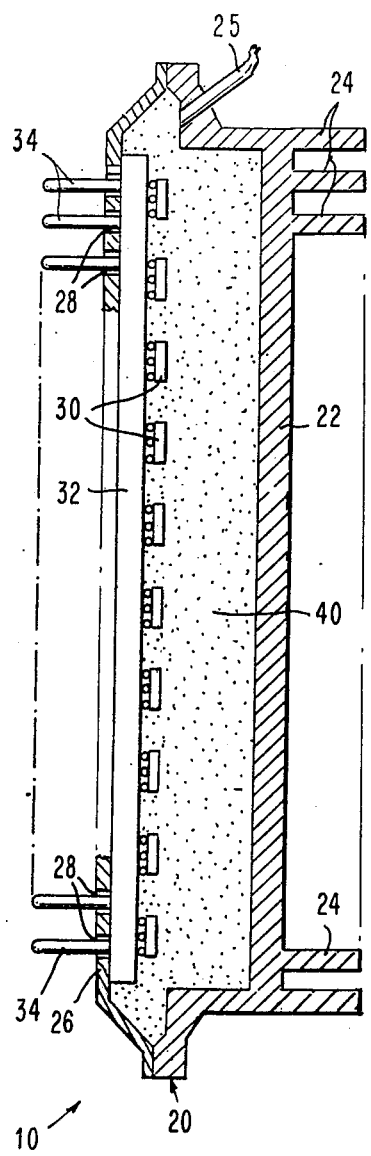
FIG. 1 is a cross-sectional diagram of an encapsulated heat dissipation system containing therein a gas at an elevated pressure, and showing the circuit chips and the heat sink.

Referring to FIG. 1, a heat dissipation system 10 comprises an encased module 20, a heat source including one or more circuit chips 30, the circuit chips 30 being mounted within said encased module 20, a gas 40 at an elevated pressure being contained within said encased module 20.

The heat dissipation system 10 according to the present invention provides a simple and yet effective cooling of the circuit chips 30. More specifically, the heat dissipation system 10 according to the present invention provides improved heat removal without any recourse to contacting the chip itself by solid plungers or solid heat conductors. Such a heat dissipation system 10 according to the present invention is also versatile in its application. As will be described hereinafter, a single heat dissipation system 10 design can be adapted for a wide range of power dissipation levels by simply varying the elevated pressure of the gas 40 contained therein. Elevated pressure, as used in this context and hereinafter, refers to a range of pressure from about thirty-five pounds per square inch to thousands of pounds per square inch, and preferably for a pressure higher than seventy pounds per square inch.

Circuit chips 30 includes solid state electronic circuits which are densely packed thereon. The power consumed by these circuits contained within the circuit chips 30 generates heat which must be removed from the circuit chips 30. In general, each of the circuit chips 30 may dissipate a different amount of power. However, the various circuits thereon, must be maintained within a desired operating temperature range in order to sustain targeted performance and reliability design objectives.

The circuit chips 30 are preferably vertically mounted (to be elaborated hereinafter) on one side of a substrate 32, which is generally made of ceramic. On the other side of substrate 32 are connecting pins 34 for plugging the encased module 20 into a board (not shown). Such a board may contain other encased modules 20, and serves as an interconnection among circuit chips 30 contained in such encased modules 20.

Instead of vertically mounted circuit chips, the circuit chips 30 may be packaged in modules. The module mounted chips are then preferably vertically mounted on one side of the substrate 32. The modules act to a degree as thermal expanders for the circuit chips to substantially reduce the associated thermal resistance.

The substrate 32 with the circuit chips 30 thereon are entirely enclosed in the encapsulated or encased module 20. Encased module 20 includes a cold sidewall 22 having heat radiating fins 24 thereon. Cold sidewall 22, as used in this context and hereinafter, refers to temperature ranges from room temperature to a few hundred degrees centigrade below zero. A back sidewall 26 of the module 20 has perforated openings 28 for accommodating the connecting pins 34 extending from the substrate 32 to the exterior of the module 20 by way of the perforated openings 28. Module 20 is tightly sealed to prevent leakage of the ambient atmosphere into the encased module 20. By way of inlet 25, an inert gas 40 such as helium or argon completely fills the interior. The inlet 25 is sealed off to form a chamber with an aspect ratio of about 1:10 to encapsulate the helium gas 40 within the encased module 20 at an elevated pressure. Alternatively, a cylinder may be attached permanently to the encased module 20 providing a reservoir to counteract small leaks.

Encapsulating the inert gas 40 at an elevated pressure within the encased module 20 is an important aspect of the improved heat dissipating system 10. In general, to remove the heat generated by the circuitry on the chips 30 to the cold sidewall 22, which together with radiating fins 24 thereon acts as a heat sink, an enhanced thermal coupling between the circuit chips 30 and the heat sink is essential. By means of the invention, it has been found that the gas 40 at elevated pressure substantially improves (to be characterized hereinafter) such a thermal coupling thereby lowering the thermal resistance and thus allowing the circuit chips 30 to operate at a much higher power level.

Encased module 20 is made of heat conductive material, such as copper, aluminum, or steel and is built to withstand a gas pressure of up to a few thousand pounds per square inch, for example, 1600 lbs. per square inch. The perforated openings 28 on the back sidewall 26 are tightly sealed by the other side surface of substrate 32, whereby only small regions of the ceramic substrate 32 are exposed to the elevated gas pressure. This arrangement helps to minimize the likelihood that leakage of the ambient atmosphere into the encased module 20 may occur due to a potential failure of the ceramic substrate 32, as a result of the elevated pressure.

The heat coupled to, and accumulated on the cold sidewall 22 of the encased module 20 is removed into the atmosphere. In this respect, heat radiating fins 24, made of a similarly heat conductive material, expands the heat radiating surface at the walls of the encased module 20 to facilitate the efficient removal of the heat transferred thereon into the atmosphere. Therefore, improving the heat conduction path or the thermal coupling from the circuit chips 30 to the heat sink not only lowers the thermal resistance, thus allowing the circuit chips 30 to operate at a higher power level, it also permits the use of a simple heat sink such as radiating fins 24 for dissipating the transferred heat into the atmosphere.

Figure 2:
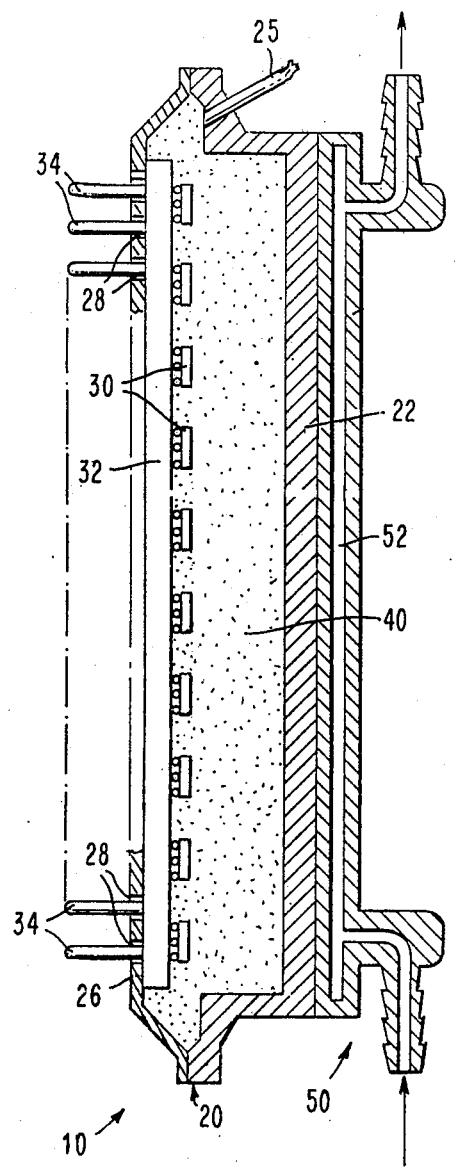
FIG. 2 is a cross-sectional diagram of the encapsulated heat dissipation system shown in FIG. 1 together with heat removal means employing a cooling fluid.

Alternatively, a preferred embodiment according to the present invention may include more elaborate heat removal means other than the hereinabove described heat radiating fins 24 (FIG. 1). Referring to FIG. 2, the cold sidewall 22 of the encased module 20 may be physically attached to a cold-plate 50. As can be seen from FIG. 2, the cold sidewall 22 is relatively flat so that the cold-plate 50 can be attached thereto in a good thermal conductive relation. FIG. 2 is only an illustration of the preferred embodiment. Naturally neither the cold sidewall 22 nor the cold-plate 50 needs to be flat. Both may be semicylindrical, and may be attached in a good thermal conductive relation. Furthermore, the cold sidewall 22 may also serve as the wall of the cold-plate 50. Using this arrangement, the heat generated by the circuit chips 30 is effectively coupled (more details to be described hereinafter) to the cold sidewall 22 by the gas 40 at an elevated pressure contained therein. The heat accumulated on the good thermal conductive cold sidewall 22 from each of the circuit chips 30, by way of the pressurized gas 40, is then transferred to the cold-plate 50. The cold-plate 50 has a cooling fluid 52 circulating therethrough which effectively removes the heat transferred to the cold-plate 50, thereby maintaining the circuit chips 30 at the desired operating temperature range.

Although cold-plate 50 is shown to be attached to only the vertical portion of cold sidewall 22, it is clear that if necessary cold-plate 50 may be modified for contacting the horizontal upper and lower portions of cold sidewall 22 for more efficient heat removal.

The heat dissipating effects of elevated pressure and cold gas temperature on module mounted chips and free hanging chips 30 in an encased environment have been investigated, and the results are shown in FIGS. 4.1–4.5.

The circuit chip 30 or the module mounted circuit chip, to a first approximation may be thought of as a flat surface. As such, this flat surface may be mounted in a vertical wall, e.g., as in FIG. 4.1 or in a horizontal wall configuration, e.g., as in FIG. 4.4.

Referring to FIGS. 4.1–4.5, different chip positionings within the encased module 20 are examined. The test chips shown are approximately 2.54 cm on a side and 0.038 cm thick. The maximum power dissipation for each positioning was determined for a temperature rise to 100° C. As can be seen, the vertical wall configuration shows a maximum power of dissipation which is 1.4–1.6 times higher than that of a horizontal configuration. This data suggests that the vertical wall configurations are the preferred mounting mode. The effects of pressure and cold gas temperature were characterized using these preferred vertical wall configurations and are described next.

The effects of the temperature of gas 40 on the thermal resistance as a function of pressure for both a vertically mounted free hanging chip and a vertically module mounted chip are illustrated in FIGS. 5 and 6. Referring to FIG. 5, the dependence of thermal resistance (T.R.) on pressure is approximately the $-\frac{1}{3}$ power for the two gas temperatures studied. In comparing the data for the room temperature range, $+26°$ C., and the low temperature range, $-45°$ C., it is seen that the thermal resistance is less in the latter at a given pressure, notwithstanding the similarity of slope. For example, at 1000 psi, the T.R. in the room temperature case is approximately 3.1° C. in²/w (20° C. cm²/w) while for the $-45°$ C. case it is 2.8° C. in²/w (18.1° C. cm²/w). In other words, by decreasing gas temperature, one obtains not only the additional "headroom" due to the additional temperature rise that can be tolerated to a maximum operating temperature, but also benefits by a reduced thermal resistance (approximately 10% in the case described). This is not a commonly expected result.

The variation of T.R. with pressure is given by:

$$\log T.R. \frac{26° C.}{cm^2} = -0.331 \log psi + 2.31$$

$$\log T.R. \frac{-45° C.}{cm^2} = -0.339 \log psi + 2.28$$

Data for a vertically module mounted chip is shown in FIG. 6. As in the free hanging chip cases, the log-log plots are linear, but the slopes are smaller. Further, the unexpected result referred to hereinabove for the free hanging chip, namely, a slope increase with decreasing temperature, is magnified in this case. The measured slopes for 25° C. and $-186°$ C. were $-0.185$, and $-0.236$ respectively. Equally significant are the facts that the thermal resistances are less in the case of the module mounted chip, when calculations are based on chip area, compared to the free hanging chip. More specifically, the thermal resistance of the module mounted chip is some five times lower than that of the free hanging chip, demonstrating that the module acts to a degree as a thermal expander. The variation of thermal resistance with pressure for the module mounted chip is also less, e.g., to the approximately $-1/5$ power as compared to the $-\frac{1}{3}$ power for the free hanging chip.

The T.R. -psi relationship describing the module are:

$$\log T.R. \frac{25° C.}{cm^2} = -0.185 \log psi + 1.422$$

$$\log T.R. \frac{-186° C.}{cm^2} = -0.236 \log psi + 1.327$$

Using such thermal module data obtained, we can generate a table of the type given in Table 1.

TABLE 1

| MODULE MOUNTED CHIP POWER DISSIPATION TO 85° C. IN He | | | |
|---|---|---|---|
| PRESSURE (psi) | $T_{gas}$ 25° C. | $-30°$ C. | $-186°$ C. |
| 15 | 1.8 W | 3.6 W | 12.1 W |
| 50 | 2.2 | 4.5 | 15.5 |
| 100 | 2.5 | 5.1 | 18.1 |
| 200 | 2.8 | 5.7 | 20.9 |
| 400 | 3.2 | 6.5 | 24.4 |
| 800 | 3.6 | 7.4 | 28.4 |
| 1600 | 4.1 | 8.3 | 33.0 |

Figure 3:
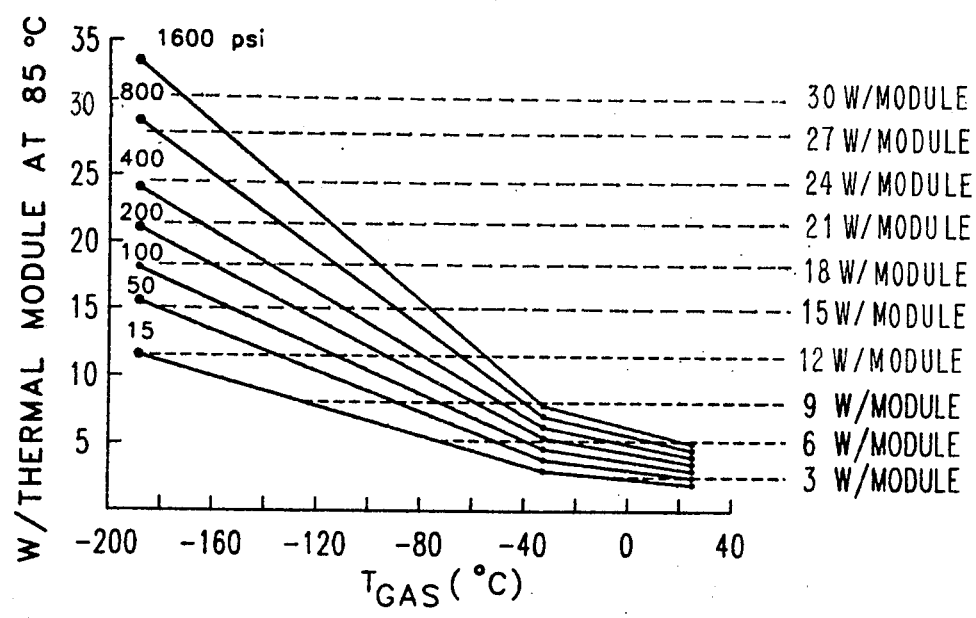
FIG. 3 shows a plot of the power/chip versus the temperature of the cold walls at different gas pressures for the system shown in FIG. 2.

For different wall temperatures, the table shows the power dissipation capabilities, in watts/chip at different system helium pressures to a final temperature of 85° C. Data such as this has been plotted as shown in FIG. 3. Here the watts/chip v.s. gas temperature is plotted for a set of pressures where in all cases the final chip operating temperature is 85° C. By defining a required heat dissipation value, one can determine what combination of gas temperatures and pressures would be required. For example, if the design objective is to have a heat dissipation system for about 21 watts per module, a gas pressure of about 200 psi and a cold sidewall 22 temperature of −186° C. should be chosen to meet the design requirement.

Referring to FIG. 3, it is of special interest to point out that at room temperature, the heat dissipation system according to the present invention is capable of dissipating 2.8 watts per module mounted chip at 200 psi, 4.1 watts per module at 1600 psi, and still higher power level at still higher elevated gas pressure. These cases are of special interest because simple and conventional forced air techniques for heat removal from the heat sink may be adequate. A design for high power dissipation without recourse to heat pipe or liquid coolant for heat removal, as is possible in these cases, represents a cost-effective and is particularly an attractive solution in many instances. Therefore, a heat dissipation system 10 according to the teaching of the present invention is adaptive and versatile in its application. More specifically, a single heat dissipation system 10 design can be adapted for a wide range of power dissipation levels by simply varying the elevated pressure of the gas 40 contained therein the encased module 20 or by varying the temperature of the cold sidewall 22. Translated in power dissipation capability, the system according to the present invention allows for removal of as much as 900 W/in$^2$ with a temperature rise to 85° C.

The increased ability of system 10 in FIGS. 1 and 2 to dissipate heat by either increasing the gas pressure contained therein, or lowering the temperature of the cold sidewall 22, or both, thereby lowering the thermal resistance is an unexpected result.

Experimentation with either argon or helium gas 40 in the encased module 22 has shown only a 30% improvement in heat transfer with helium. This result tends to suggest that thermal conduction in the gas 40 is not the primary heat removal mechanism, and that conduction across the gas boundary layer is not the rate-limiting step in heat removal. Since radiation effects would be the same with both gases and would be small in the temperature range investigated, it appears that free convection may be the primary mechanism for heat removal. The underlying argument used to empirically describe free convection is based on a buoyancy driving force where heated gas around the vertically mounted circuit chip 30 is buoyed up by the cold gas underneath the circuit chip 30. The imparted gas 40 acceleration tends to decrease the boundary layer thickness thereby increasing the thermal conduction to the moving gas 40.

Although gas expansion as a driving force appears as a thermal expansion coefficient term in open system free convection analyses, gas expansion may not play as strong a role in a closed or encased system, as is the case here. For example, the circuit chip 30 would tend to expand the gas 40 rapidly, imparting an additional instantaneous velocity to a gas 40 stream. However, in a closed system such as in encased module 20 this expanding gas force could be counteracted by a restoring force due to the cold gas which it is pushing above it, and along the cooling walls 22, creating a reverse force. Although vertical plate free convection cooling has been analyzed extensively, such theoretical treatment does not account for the free convective cooling in a sealed environment, or at elevated gas pressure in a manner characterized and taught hereinabove.

As described hereinabove, the heat dissipating system 10 according to the present invention is capable of efficient heat removal without any recourse to contacting the delicate circuit chip 30 itself by solid plungers or other solid heat conductors. In particular, a single device design, according to the teaching of this invention can be adapted for a wide range of power dissipation levels by simply varying the elevated pressure of the gas 40 contained in the encased module 20 or by varying the temperature of the cold sidewall 22 of the encased module 20.

Although the heat dissipating system 10 in FIGS. 1 and 2 are both shown and described to be for cooling circuit chips 30 and module mounted circuit chips, it is clear that such a system according to the present invention can be used to cool other electronic apparatus, including motors and other localized heat sources. The choice of circuit chips 30 hereinaabove as a heat source is for purpose of illustration only.

Although argon and helium gases are both specifically described as appropriate for filling the encased module 20, other acceptable fluids operating at an elevated pressure may also be used to improve the thermal coupling between the heat source 30 and the cold sidewall 22 of the encased module 20.

From the preceding detailed description of applicants' invention, it is seen that heat dissipating system according to the present invention have advantages heretofore not been possible to achieve. In addition to the variations and modifications to applicants' disclosed apparatus which have been suggested, many other variations and modifications will be apparent to those skilled in the art, and accordingly, the scope of applicants' invention is not to be construed to be limited to the particular embodiments shown or suggested.

Having thus described our invention, what we claim as new, and desire to secure by Letters Patent is:

1. A heat dissipating system for cooling a heat source comprising:
   an encased module having side walls;
   said heat source being mounted within said encased molule such that there is a definite spacing for promoting a natural convection between said heat source and said module side walls, said heat source being at a desired operating temperature;
   the temperature of the walls of said encased module being lower than said operating temperature of said heat source; and
   a gas at an elevated pressure for promoting said natural convection, and being contained within said encased module for providing an enhanced thermal coupling between said heat source and the walls of said encased module primarily by natural convection of said gas;
   whereby heat removal from said heat source is increased.

2. A heat dissipating system as set forth in claim 1 including means for reducing the temperature of the walls of said encased module so as to reduce the thermal resistance of said heat dissipating system, whereby heat removal from said heat source is increased.

3. A heat dissipating system as set forth in claim 1 wherein said heat source is a vertically mounted circuit chip.

4. A heat dissipating system as set forth in claim 1 wherein said heat source is a vertically mounted chip bearing module.

5. A heat dissipating system as set forth in claim 1 wherein said gas is helium.

6. A heat dissipating system as set forth in claim 2 including means for expanding the heat radiating surfaces at the walls of said encased module.

7. A heat dissipating system as set forth in claim 6 including means for removing heat transferred to the heat radiating surfaces at the walls of said encased module.

8. A heat dissipating system for cooling a heat source comprising:
   an encased module;
   said heat source being mounted within said encased module such that there is a definite spacing for promoting a natural convection between said heat source and module side walls, said heat source being at a desired operating temperature;
   the temperature of the walls of said encased module being lower than said operating temperature of said heat source;
   means for reducing the temperature of the walls of said encased module so as to reduce the thermal resistance of heat dissipating system; and
   a gas at an elevated pressure for promoting said natural convection, and being contained within said encased module for providing an enhanced thermal coupling between said heat source and the walls of said encased module primarily by natural convection of said gas;
   whereby heat removal from said heat source is increased.

9. A heat dissipating system as set forth in claim 8 wherein said heat source is a vertically mounted circuit chip.

10. A heat dissipating system as set forth in claim 8 wherein said heat source is a vertically mounted chip bearing module.

11. A heat dissipating system as set forth in claim 8 wherein said gas is helium.

12. A heat dissipating system as set forth in claim 8 including means for expanding the heat radiating surfaces at the walls of said encased module.

13. A heat dissipating system as set forth in claim 12 including means for removing heat transferred to the heat radiating surfaces at the walls of said encased module.

14. In a heat dissipating system for cooling a heat source which is at a desired operating temperature and being contained within an encased module having means for expanding the heat radiating surfaces at the walls of said encased module, the temperature of the walls of said encased module being lower than said operating temperature of said heat source, wherein the improvement comprises:
   said heat source being mounted within said encased module such that there is a definite spacing for promoting a natural convection between said heat source and said module walls;
   means for reducing the temperature of the walls of said encased module so as to reduce the thermal resistance of said heat dissipating system; and
   a gas at an elevated pressure for promoting said natural convection, and being contained within said encased module for providing an enhanced thermal coupling between said heat source and the walls of said encased module primarily by natural convection of said gas.

15. In a heat dissipating system as set forth in claim 14, wherein the improvement comprises means for vertically mounting said heat source in said encased module.

* * * * *